United States Patent [19]

Truong et al.

[11] Patent Number: 5,657,268

[45] Date of Patent: Aug. 12, 1997

[54] ARRAY-SOURCE LINE, BITLINE AND WORDLINE SEQUENCE IN FLASH OPERATIONS

[75] Inventors: Phat C. Truong; Sung-Wei Lin, both of Houston, Tex.

[73] Assignee: Texas Instruments Incorporated, Dallas, Tex.

[21] Appl. No.: 560,670

[22] Filed: Nov. 20, 1995

[51] Int. Cl.$^6$ .................................................. G11C 7/00
[52] U.S. Cl. .................. 365/185.13; 365/185.11; 365/185.12; 365/185.02
[58] Field of Search .................. 365/185.13, 185.12, 365/185.02, 185.11, 185.29, 218, 185.33

[56] References Cited

U.S. PATENT DOCUMENTS

| | | | |
|---|---|---|---|
| 5,065,364 | 11/1991 | Atwood et al. | 365/185.02 |
| 5,185,718 | 2/1993 | Rinerson et al. | 365/218 |
| 5,384,742 | 1/1995 | Miyakawa et al. | 365/185.13 |

*Primary Examiner*—David C. Nelms
*Assistant Examiner*—Vu A. Le
*Attorney, Agent, or Firm*—Theodore D. Lindgren; Leo N. Heiting; Richard L. Donaldson

[57] ABSTRACT

In a multi-sector nonvolatile memory array in which each memory cell has a drain coupled to a bitline, each memory cell of each sector has a source coupled to a common array-source line, each memory cell in a row of the first sector has a control gate coupled to a wordline and each memory cell of a row in another sector has a control gate coupled to that wordline, a method for programming a memory cell in one sector of said method includes connecting at least the second common array-source line to each bitline coupled to drains of columns of memory cells in the another sector, then biasing at a positive voltage both the common array-source line and the bitlines coupled to drains of memory cells in columns of the another sector, and then applying a programming voltage to the selected wordline coupled to the control gate of the selected cell in the first sector. An erasing method includes connecting the wordlines to a reference voltage, connecting at least one deselected common array-source line to each bitline coupled to drains of columns of memory cells in the deselected sector, then biasing at a positive voltage both the deselected common array-source line and said bitlines coupled to drains of memory cells in columns of the deselected sector, and then applying a positive erasing voltage to said common array-source line of the selected sector.

12 Claims, 1 Drawing Sheet

ARRAY-SOURCE LINE, BITLINE AND WORDLINE SEQUENCE IN FLASH OPERATIONS

BACKGROUND OF THE INVENTION

This invention relates to Flash Electrically-Programmable Erasable Read-Only-Memories (Flash EPROMs). In particular, this invention relates to a circuit for protecting such devices from stress, or soft program, during either program or erase operation.

Flash EPROMs are generally described in U.S. patent application Ser. No. 08/315,526 filed Sep. 30, 1994, entitled "FLASH EPROM CONTROL WITH EMBEDDED PULSE TIMER AND WITH BUILT-IN SIGNATURE ANALYSIS", also assigned to Texas Instruments Incorporated. That Patent Application is hereby incorporated herein.

The memory cell arrays of many Flash EPROMs are formed in groups of rows and columns of memory cells, or sectors of memory cells. In many such cases, the various sectors share wordlines (connected to control gates of memory cells) and/or bitlines (connected to the drains of memory cells) with other sectors. In the type of memory-cell array discussed here, the sources of all of the memory cells in a sector are connected to a common terminal, called an "array-source line".

In Flash EPROMs that do not have electrically isolated sectors or have sectors with weak electrical isolation, a program or erase operation in one sector may disturb (stress, or soft program) the other sectors. The degree of damage to other sectors increases with the number of program or erase cycles that cause voltage stress on those other sectors.

There is a need for a sequence of applying voltages to array-source lines, bitlines and wordlines of sectors during operations such that the sequence reduces disturb voltages in other sectors. Fulfillment of that need would improve the endurance of Flash EPROM devices.

Past methods for solving the problem have involved applying a low voltage at the array-source line terminal to improve the endurance.

SUMMARY OF THE INVENTION

The method of this invention overcomes a problem in those Flash memories that do not have physically isolated sectors by providing a sequence of array-source line, bitline and wordline voltages that reduces disturbance (stress or soft program) of other sectors during program or erase of one sector. As a result, the method improves the endurance of Flash memories. The circuit and sequence of this invention overcome the stress and soft-program problems by biasing both the array-source lines and the bitlines at a particular voltage level before high voltage is applied to the wordline. The circuit and sequence avoid disturb in floating-gate memory cells even when the wordlines are at voltage supply $V_{cc}$ level by connecting the array-source lines and the bitlines when applying a bias voltage to the array-source line. Breakdown between the selected array-source line and an adjacent deselected array-source line is avoided during the erase operation by biasing the deselected array-source line to the proper bias level.

DETAILED DESCRIPTION OF THE INVENTION

Figure 1:
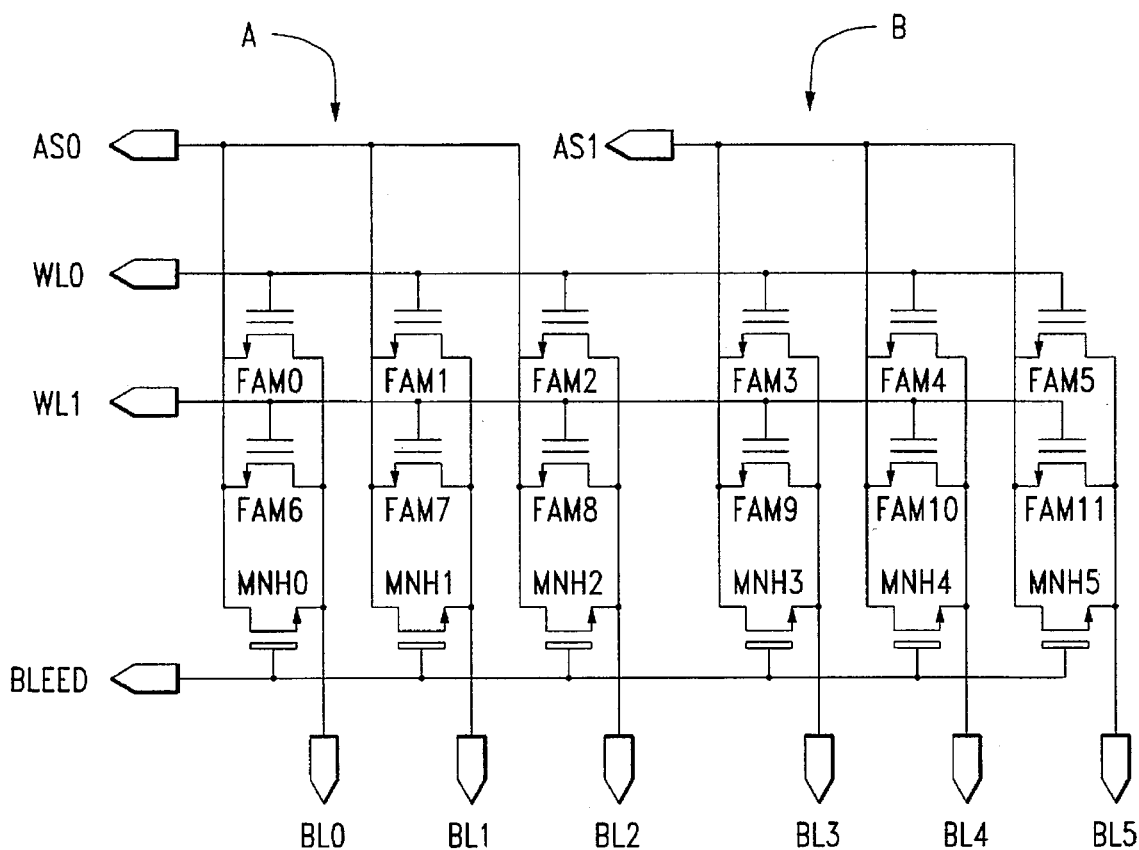
FIG. 1 is a schematic diagram illustrating adjacent sectors of an array of memory cells and including N-channel pass-gate transistors connecting array-source lines and bit lines.

In FIG. 1, memory cells FAM0–FAM2 and FAM6–FAM8 represent perhaps about a thousand memory cells arranged in rows and columns to form sector A of a Flash EPROM. Memory cells FAM3–FAM5 and FAM9–FAM11 represent perhaps another thousand memory cells arranged in rows and columns to form sector B of the Flash EPROM adjacent to sector A. The control gates of the representative row of memory cells FAM0–FAM2 of sector A and memory cells FAM3–FAM5 of sector B are connected to common wordline WL0. The control gates of the representative row of memory cells FAM5–FAM7 of sector A and memory cells FAM9–FAM11 of sector B are connected to common wordline WL1. The drains of memory cells FAM0 and FAM6 are connected to common bitline BL0. Similarly, the drains of other memory cells in representative columns are connected to common bitlines BL1–BL5. The sources of the representative sector A memory cells FAM0–FAM2 and FAM6–FAM8 are connected to common array-source line AS0. Similarly, the sources of representative sector B memory cells FAM3–FAM5 and FAM9–FAM11 are connected to common may-source line AS1. While connections from the sources of the memory cells are shown as vertical lines in FIG. 1, in certain type of Flash EPROMs the connections are diffused regions parallel to the wordlines. In that type of Flash EPROM, the diffused connection between a row of sources of sector A is separated from the diffused connection between a row of sources of sector B by a very narrow field oxide insulator grown on the substrate.

With array source lines AS0 and AS1 grounded, a positive programming voltage to either of wordlines WL0 and WL1 for the purpose of programming a memory cell in sector A, for example, causes voltages in sector B that tend to stress the memory cells of sector B. Similarly, a positive voltage on array-source line AS0 with array-source line AS1 at ground tends to stress any narrow field oxide separating the conductors of sectors A and B. If the field oxide conductor partially fails, then the memory cells of sector B are subjected to unwanted erasing stresses. Subjecting the memory cells of sector B to such programming and erasing stresses tends to cause the floating gates of those cells to gain of lose charge. Subjection to several cycles of such stresses tends to compromising the data stored in those floating gates.

Figure 2:
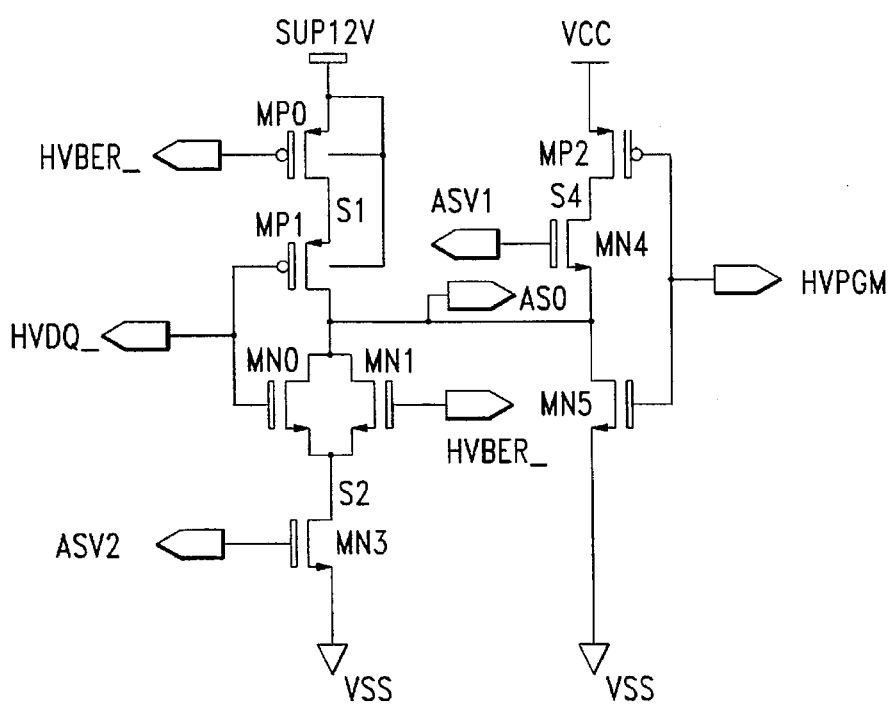
FIG. 2 illustrates array-source-line logic circuitry of this invention for use with the schematic diagram of FIG. 1.

The operation of the circuits of FIG. 1 and FIG. 2 is described below. During setup of program operation, transistors MNH0, MNH1, ... MNH5 are ON, which connects the array-source line AS0 to associated bitline terminals BL0–BL2 and the array-source line AS1 to associated bitline terminals BL3–BL5 (FIG. 1). Terminal ASV1 is at a predetermined voltage level and terminal ASV2 is at voltage equal to one N-channel-threshold-voltage $V_{TN}$ level.

The circuit of FIG. 2 indicates an output for connection to array-source line AS0 (sector A) of FIG. 1. An identical circuit is formed for connection to array-source line AS1 (sector B) of FIG. 1. Other identical circuits are formed for array-source lines and the associated sectors.

Assuming that sector A is the selected sector, terminal HVBER_ is at a high-voltage level that cuts off the SUP12V terminal from the array-source line AS0 of that selected sector, transistor MP0 is OFF and transistor MN1 is ON; terminal HVPGM is at high level, which turns transistor MN5 ON and turns transistor MP2 OFF. The selected array-source line AS0 and its associated bitlines BL0–BL2 are at ground-voltage, or reference-voltage, $V_{ss}$ level. For deselected sector B, the terminal HVPGM of its identical circuit is low, which turns transistor MN5 OFF and turns transistor MP2 ON. Supply voltage $V_{cc}$, through transistors MP2 and MN4 brings the deselected array-source line AS1 voltage level up to a pre-determined voltage at terminal ASV1 less one N-channel-threshold-voltage $V_{TN}$. A low current in transistor MN3 keeps the deselected array-source line AS1 floating above the voltage at terminal ASV1 less one N-channel-threshold-voltage $V_{TN}$. All bitlines BL3–BL5 in the deselected sector are at bias level (the voltage at terminal ASV1 less one N-channel-threshold-voltage $V_{TN}$), through transistors MNH0, MNH1, . . . MNH5. After the deselected array-source line AS1 is at bias level (the voltage at terminal ASV1 less one N-channel-threshold-voltage $V_{TN}$), the wordline WL0 or WL1 of the selected memory cell is brought up to 12 V and integrated-circuit memory is ready to continue with the programming cycle of operation. The bias level may be, for example, about 1.5 V.

Continuing the programming cycle, terminal BLEED is at ground level $V_{ss}$ and all transistors MNH0, MNH1, . . . MNH5 are turned OFF. For the selected sector A, the selected bitline is brought up to 7 V to program the selected memory cell. (That part of the circuit is not shown). For the deselected sector B, the army-source line AS1 and the bitlines BL3–BL5 are at bias level, which eliminates the stress caused by high-voltage level at wordlines.

During discharge cycle of program operation, the selected bitline BL0, BL1 or BL2 is discharged to ground level and the selected wordline WL0 or WL1 is brought down to $V_{cc}$ level. After the selected wordline is at $V_{cc}$ level, the deselected array-source line AS1 is brought to ground level $V_{ss}$ and all deselected bitlines BL0–BL2 or BL3–BL5 are discharged to ground level $V_{ss}$ through transistors MNH0, MNH1 . . . MNH5. All devices MNH0, MNH1, . . . MNH5 are then mined OFF to isolate the array-source line AS0 or AS1 from the bitlines BL0–BL2 or BL3–BL5.

During set-up of the sector erase operation, transistors MNH0, MNH1, . . . MNH5 are ON due to $V_{cc}$, minus a threshold voltage, applied to terminal BLEED, which connects the array-source lines AS0 and AS1 to the associated bitlines BL0–BL2 or BL3–BL5 (FIG. 1). Terminal ASV1 of the FIG.2 circuits connected to both selected sector A and deselected sector B are at a pre-determined voltage level and terminal ASV2 is at the N-channel-threshold-voltage $V_{TN}$ level. All of terminals HVPGM are low, which cuts off the current path from the array-source lines AS0 and AS1 to ground $V_{ss}$ through transistor MN5. Transistor MP2 is ON, which supplies current to the array-source lines AS0 and AS1 and brings the array-source lines AS0 and AS1 to a bias level (the voltage at terminal ASV1 less one N-channel-threshold-voltage $V_{TN}$). Terminal HVDQ__ is at a high voltage level, which cuts off the current supply to the array-source line AS1 through transistor MP1. In the identical circuit of FIG. 2 connected to terminal AS0 of selected sector A, HVBER$_{13}$ is at a low level. In FIG. 2 circuit connected to terminal AS1 of deselected sector B, HVBER$_{13}$ is at a high level. All bitlines BL0–BL2 and BL3–BL5 are also at bias level through transistors MNH0, MNH1, . . . MNH5. The bias level may be, for example, about 1.5 V.

Continuing the erase cycle, terminal HVDQ__ is at low level. For the selected sector A, both transistors MP0 and MP1 are ON, which connects the array-source line AS0 to the terminal SUP12V. All bitlines BL0–BL2 in the selected sector are also brought up to $V_{cc}$ less two N-channel-threshold-voltages $V_{TN}$ to avoid punch-through to the army floating gate memory cells. For deselected sectors such as sector B, transistor MP0 is OFF, both the array-source line AS1 and the associated bitlines BL3–BL5 remain at bias level (the voltage at terminal ASV1 less one N-channel-threshold-voltage $V_{TN}$). This avoids breakdown between the selected array-source line AS0 and adjacent deselected array-source line AS1.

During the discharge cycle of the erase operation terminal HVDQ__ is at high voltage level and transistor MP1 is OFF. Terminal ASV1 is at ground level $V_{ss}$, which cuts off current from the supply voltage terminal $V_{cc}$. Terminal ASV2 then goes high to discharge all array-source lines AS0 and AS1 to ground. All bitlines BL0–BL2 or BL3–BL5 are also discharged to ground through transistors MNH0, MNH1, . . . MNH5. The signal at terminal BLEED then goes low to isolate all array-source lines AS0 and AS1 from the associated bitlines BL0–BL2 and BL3–BL5, and terminal HVPGM goes high to end the erase operation.

The circuit and sequence of this invention overcome the stress and soft program problem by (1) reducing stress by biasing both the array-source lines AS0 and AS1 and the bitlines BL0–BL2 and BL3–BL5 to a voltage level before high voltage is applied to the wordline, (2) avoiding disturb in floating-gate memory cells even when the wordlines are at supply voltage $V_{cc}$ level by connecting the array-source line AS0 or AS1 and the respective bitlines BL0–BL2 or BL3–BL5 when applying a bias voltage to the array-source line AS0 or AS1, and (3) avoiding breakdown between the selected array-source line AS0 or AS1 and an adjacent array-source line AS1 or AS0 during the erase operation by biasing the deselected array-source line AS1 or AS0 to the proper bias level.

The array-source line, bitline and wordline voltage sequence circuitry comprises:

a) N-channel pass-gate transistors between the array-source line AS0 and AS1 and the bitlines BL0–BL2 and BL3–BL5 to connect the array-source lines AS0 and AS1 and the bitlines BL0–BL2 and BL3–BL5 during program set-up, during program discharge and during erase operation.

b) Array-source-line logic in FIG. 2 that allows a bias voltage to be applied to a deselected array-source line AS0 or AS1 during program/erase operation. The array-source-line logic includes five N-channel transistors and three P-channel transistors.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A method for programming at least one selected memory cell in a first sector of a nonvolatile memory array, said array having at least a second sector, said first and second sectors of memory cells arranged in rows and columns, each memory cell of each column having a drain coupled to a bitline, each memory cell of said first sector having a source coupled to a first common array-source line, each memory cell of said second sector having a source coupled to a second common array-source line, each memory cell of a row in said first sector having a control gate coupled to a wordline and each memory cell of a row in said second sector having a control gate coupled to said wordline, said method comprising:

connecting at least the second common array-source line to each bitline coupled to drains of columns of memory cells in the second sector;

then biasing at a first positive voltage both said second common array-source line and said bitlines coupled to drains of memory cells in columns of the second sector; and then applying a programming voltage to the selected wordline coupled to the control gate of the selected cell then applying second positive voltage to the selected bitline coupled to the drain of the selected memory cell;

then discharging the Selected bitline to ground level and the selected wordline to a supply voltage level;

then discharging the second array-source line and the bitlines connecting the columns of memory cells of the second sector to ground level; and then disconnecting the second array-source line from the bitlines connecting the columns of memory cells of the second sector.

2. The method of claim 1, wherein said step of connecting at least the second common array-source line to each bitline coupled to drains of memory cells in columns of the second sector includes connecting the first common array-source line to each bitline coupled to drains of memory cells in columns of the first sector and further comprising:

after said step of biasing at said first positive voltage both said second common array-source line and said bitlines coupled to drains of memory cells in columns of the second sector, then disconnecting said first and second common array-source lines from said bitlines coupled to drains of memory cells in columns of said first and second sectors.

3. The method of claim 1, further comprising:

then applying a second positive voltage to the bitline coupled to the drain of the selected memory cell.

4. The method of claim 1, further including the step of applying about seven volts to the bitline coupled to the drain of the selected memory cell.

5. The method of claim 1, wherein said programming voltage is about twelve volts.

6. The method of claim 1, wherein said bitlines connecting the columns of memory cell of said second sector are coupled to said second array-source line by field-effect transistors having a common gate connection.

7. The method of claim 1, wherein said first positive voltage is about 1.5 volts.

8. A method for erasing a first sector of a nonvolatile memory array, said array having at least a second sector, said first and second sectors of memory cells arranged in rows and columns, each memory cell of each column having a drain coupled to a bitline, each memory cell of said first sector having a source coupled to a first common array-source line, each memory cell of said second sector having a source coupled to a second common array-source line, each memory cell of a row in said first sector having a control gate coupled to a wordline and each memory cell of a row in said second sector having a control gate coupled to said wordline, said method comprising:

connecting said wordlines to a reference voltage; connecting at least the second common array-source line to each bitline coupled to drains of columns of memory cells in the second sector;

then biasing at a positive bias voltage both said second common array-source line and said bitlines coupled to drains of memory cells in columns of the second sector; and then applying a positive erasing voltage to said first common array-source line.

9. The method of claim 8, wherein said step of connecting at least the second common array-source line to each bitline coupled to drains of memory cells in columns of the second sector includes connecting the first common array-source line to each bitline coupled to drains of memory cells in columns of the first sector.

10. The method of claim 8, further including:

then discharging all array-source lines and all bitlines to said reference voltage; and then disconnecting said first and second common array-source lines from said bitlines coupled to drains of memory cells in columns of said first and second sectors.

11. The method of claim 8, wherein said positive bias voltage is about 1.5 volts.

12. The method of claim 8, wherein said positive erasing voltage is about twelve volts.

* * * * *